United States Patent [19]

Kataoka

[11] Patent Number: 5,005,969
[45] Date of Patent: Apr. 9, 1991

[54] OPTICAL PROJECTION APPARATUS WITH THE FUNCTION OF CONTROLLING LASER COHERENCY

[75] Inventor: Keiji Kataoka, Kawagoe, Japan
[73] Assignee: Hitachi, Ltd., Tokyo, Japan
[21] Appl. No.: 330,291
[22] Filed: Mar. 29, 1989

[30] Foreign Application Priority Data

Mar. 30, 1988 [JP] Japan ............................ 63-74293

[51] Int. Cl.⁵ .................. G03B 21/14; G02B 27/10
[52] U.S. Cl. .................................. 353/122; 353/82; 350/169; 350/172
[58] Field of Search ............... 353/122, 38, 82; 350/169, 171, 172, 174, 167

[56] References Cited

U.S. PATENT DOCUMENTS

| | | | |
|---|---|---|---|
| 3,485,552 | 12/1969 | Adler | 350/169 |
| 3,879,109 | 4/1975 | Thomas | 350/169 |
| 4,093,964 | 6/1978 | Aughton | 350/169 |
| 4,367,009 | 1/1983 | Suzki | 350/169 |
| 4,397,525 | 8/1983 | Ahlen | 350/171 |
| 4,619,508 | 10/1986 | Shibuya et al. | 353/122 |
| 4,765,715 | 8/1988 | Matsudaira et al. | 350/169 |
| 4,841,341 | 6/1989 | Ogawa et al. | 350/167 |

FOREIGN PATENT DOCUMENTS 0155826  9/1984  Japan .................. 350/169

Primary Examiner—William A. Cuchlinski, Jr.
Assistant Examiner—William C. Dowling
Attorney, Agent, or Firm—Antonelli, Terry, Stout & Kraus

[57] ABSTRACT

Disclosed is an optical projection apparatus with the function of controlling laser coherency which comprises a laser source, a splitting device for splitting light emitted from the laser source into a plural incoherent split light beams having light intensity equal to each other, an illumination optical system for focusing each of the split light beams, and a projection optical system for projecting an image of a pattern of a mask illuminated with the split light beams from the illumination optical system onto a sample.

9 Claims, 3 Drawing Sheets

OPTICAL PROJECTION APPARATUS WITH THE FUNCTION OF CONTROLLING LASER COHERENCY

BACKGROUND OF THE INVENTION

The present invention generally relates to an optical projection apparatus for producing semiconductor devices or the like, and particularly relates to an optical projection apparatus with the function of controlling laser coherency by use of an excimer laser.

Conventionally, the optical projection apparatus using a laser has been discussed, for example, in "Development in Semiconductor Micro-lithography", SPIE (The Society of Photo-Optical Instrumentation Engineers), Vol. 174, pp. 28-36, 1979. In this document, light emitted from a krypton laser 1 is scanned by scanning mirrors 3 and 6 in the x- and y-direction as shown in FIG. 2a, and the scanned light is converged to the position of an entrance pupil 10 of a projection lens 11 by means of a condenser lens 8 so as to be scanned in the x- and y-direction as shown in FIG. 2b. A mask 9 is disposed behind the condenser lens 8 so that a pattern of the mask 9 is focused on an image plane 12 by the projection lens 11. The reference numerals 2, 4, 5, and 7 designate elements constituting a focusing optical system. The ratio of the scanning area a of a scanning spot shown in FIG. 2b to the size R of the entrance pupil 10, that is, $\sigma = a/R$, is called a coherence factor. With respect to the coherence factor $\sigma$, $\sigma = 0$ and $\sigma = \infty$ correspond to incoherent radiation and coherent radiation respectively. In the coherent radiation, the image contrast can be made high, while the limiting resolution cannot be made high. In the incoherent radiation, on the contrary, the limiting resolution can be made high, while the image contrast becomes low. Therefore, generally, the coherence factor $\sigma$ is selected to be about 0.7. In the system shown in FIGS. 2a and 2b, the entrance pupil 10 is scanned by a scanning spot so that an image of the mask pattern 9 is formed on the image plane 12 with respect to every scanning position. Thus, the image of the mask pattern 9 is recorded as superposition of the light intensity, not of the light amplitude, on a photosensitive material mounted on the image plane 12. As the result, interference noises (speckle noises appearing on the image plane 12) due to laser coherency are remarkably reduced.

SUMMARY OF THE INVENTION

An object of the present invention is to provide an optical projection apparatus for realizing high-accurate optical projection in which interference noises due to laser coherency are reduced without mechanically scanning the laser light.

That is, in the foregoing conventional apparatus, there have been the following problems:
(1) It is difficult to realize high-accurate optical projection because of vibrations generated when laser light is scanned by the scanning mirrors 3 and 6;
(2) When an excimer laser is used as the laser, it is necessary to establish synchronization between the radiation timing of the laser pulse and the scanning position of the scanning mirror in a pulse laser such as an excimer laser so that the apparatus becomes large in size; and
(3) In the case of using an excimer laser, fluctuations in the output energy of the laser pulse are large so that the radiation energy distribution on the pupil is made uneven by the output fluctuation during scanning time.

It is therefore an object of the present invention to solve the foregoing problems in the prior art and to realize higher-accurate optical projection.

In order to attain the above objects, according to the present invention, the optical projection apparatus with the function of controlling laser coherency comprises a laser source, a splitting device for splitting light emitted from the laser source into a plural incoherent split light beams having light intensity equal to each other, an illumination optical system for focusing each of the split light beams, and a projection optical system for projecting an image of a pattern of a mask illuminated with the split light beams from the illumination optical system onto a sample.

BRIEF DESCRIPTION OF THE DRAWINGS

These and other features, objects and advantages of the present invention will be apparent from the following detailed description with reference to the accompanying drawings.

DESCRIPTION OF THE PREFERRED EMBODIMENT

Figure 1:
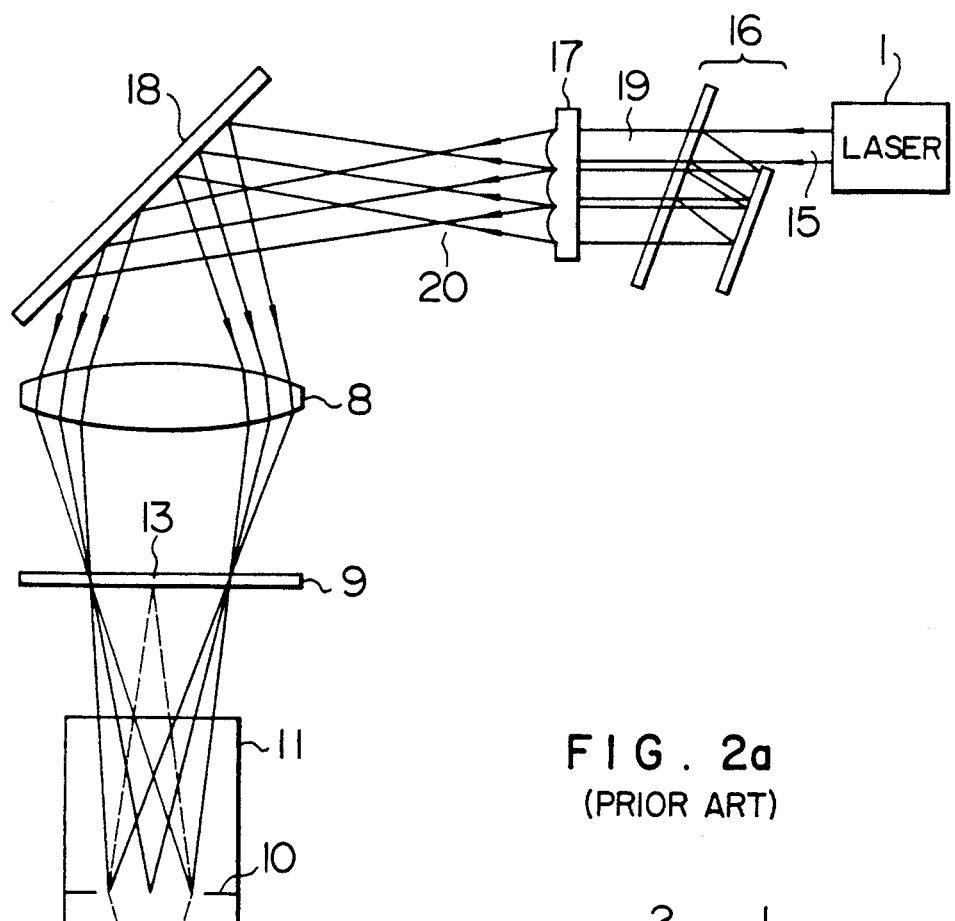
FIG. 1 is a diagram showing an embodiment of the optical projection apparatus with the function of controlling laser coherency according to the present invention.
Figure 2A:
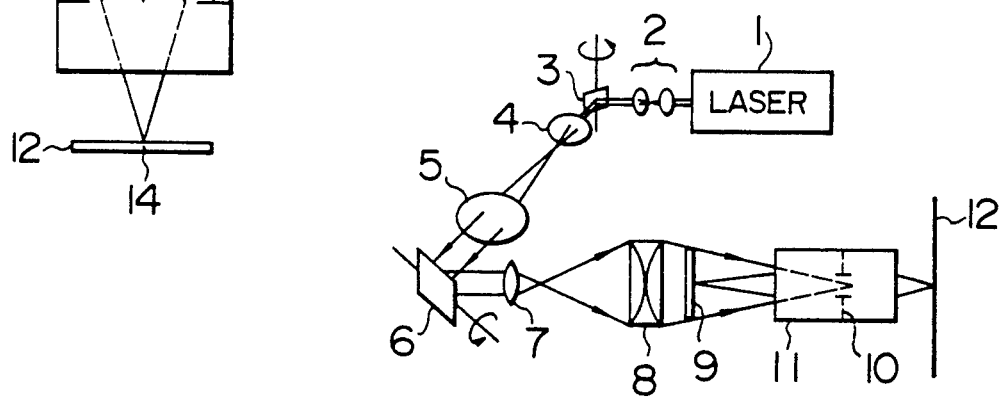
FIGS. 2a and 2b are diagrams showing the configuration of a conventional laser optical projection apparatus.
Figure 2B:
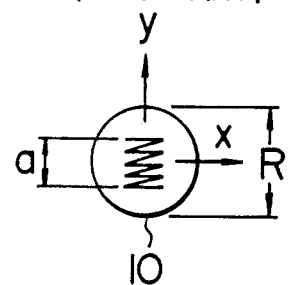

FIG. 1 shows the whole configuration of an embodiment of the present invention. Laser light 15 emitted from a KrF excimer laser 1 is converted into split light 19 split in the form of an array arranged in one dimension by a splitting device 16 which will be described in detail later. The split light 19 is then entered into a lens array 17 functioning as an integrator. The lens array 17 forms an array of point images 20. The condenser lens 8 is set so as to focus the array of point images 20 on a pupil plane 10 of a projection lens 11. The reference numeral 18 designates a mirror. If a mask 9 is disposed on a focal plane of the condenser lens 8, all the split light radiates one and the same region of the mask 9 as shown in the drawing, so that uniform illumination can be obtained. An illuminated mask pattern 13 is focused on a position 14 on a wafer 12 by means of the projection lens 11. As the laser light source 1, an ArF excimer laser, an Ar laser, or the like, may be used in place of the foregoing KrF excimer laser.

Figure 3:
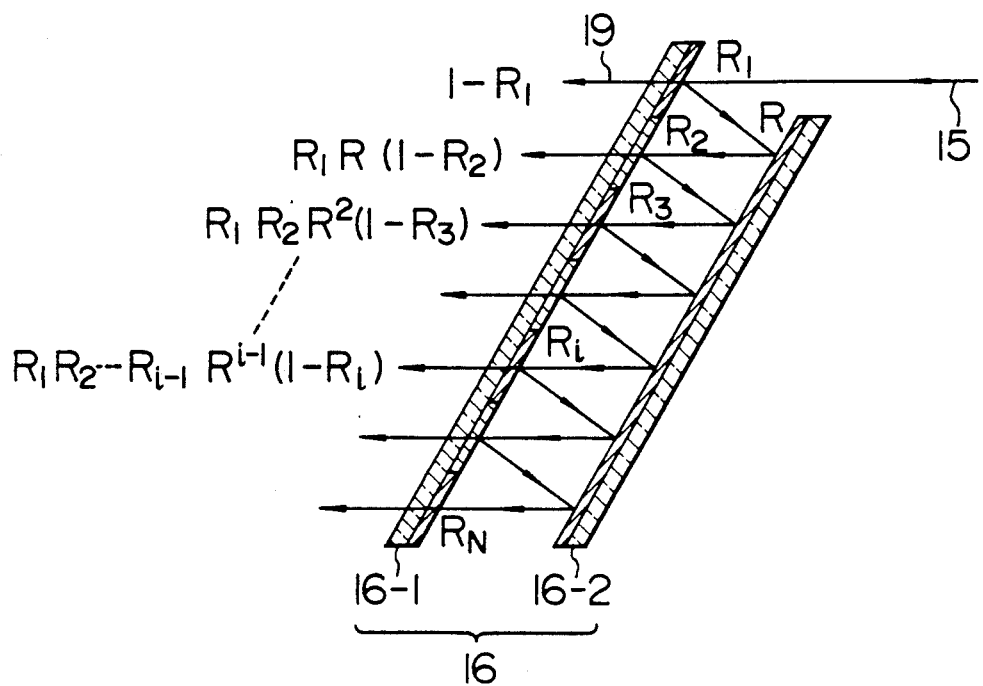
FIG. 3 is a diagram showing the configuration of an example of the splitting device to be used in the present invention.

FIG. 3 is a diagram for explaining the splitting device 16 to be used in the present invention. FIG. 3 shows the case where laser light 15 from the laser such as an excimer laser or the like enters the splitting device 16 with light intensity of "1". The splitting device 16 is constituted by two parallel flat plates 16-1 and 16-2. The flat plate 16-1 acting as a first reflection plate is constituted by N divisional portions formed on a substrate of quartz glass or the like, and the respective N divisional portions have reflection coefficients $R_1$ through $R_N$ different from each other. The divisional portions are formed by providing a coating of a reflection material, for example, $MgF_2$, $CeO_2$, or the like, on the substrate. The flat plate 16-2 acting as a second reflection plate is provided for returning light reflected from the first reflection plate 16-1 to one of the divisional portions of the reflection plate 16-1 having different reflection coefficients. The flat plate 16-2 is formed by providing a coating of a material, for example, $MgF_2$, $CeO_2$, or the like, having a reflection factor R, on quartz glass. The coating is formed, for example, by evaporation or the like. If the two reflection plates 16-1 and 16-2 are arranged so that one split laser light beam is emitted from each of the divisional portions of the first reflection plate 16-1 as shown in FIG. 3, the respective split light beams from the N divisional portions are represented by $1-R_1$, $R_1R(1-R_2)$, $R_1R_2R^2(1-R_3)$, ..., as shown in the drawing. If it is desirable that the light intensity of all the split light beams is equal to each other, the reflection factor to be set in each of the divisional portions is obtained as follows. That is, from the equation $$R_1R_2 \ldots R_{i-1}R^{i-1}(1-R_i) = R_1R_2 \ldots R_{i-2}R^{i-2}(1-R_{i-1})$$

the condition that the light intensity of the split light beam from the i-th divisional portion is equal to that of the split light beam from the (i−1)th divisional portion is expressed by the following equation:

$$R_{i-1} = 1/\{1 + R(1-R_i)\}.$$

In order to make the efficiency of use of light of the splitting device high, it is desirable that the reflection factor R of the second reflection plate 16-2 is made equal to 100%, that is, made to be about "1". Further, in the case of using the splitting device for realizing N pieces of splitting, if the reflection coefficient $R_N$ of the N-th divisional portion is made equal to "0", laser light can be economically utilized. In the case of using a splitting device having eight divisional portions (that is, N=8), respective reflection coefficients $R_1$ through $R_8$ of the eight divisional portions obtained by using the foregoing expression are expressed as follows, on the assumption that R=1.

$R_8 = 0$
$R_7 = 0.5$
$R_6 = 0.667$
$R_5 = 0.75$
$R_4 = 0.8$
$R_3 = 0.833$
$R_2 = 0.857$
$R_1 = 0.875$

The splitting device satisfying the foregoing conditions can be designed by controlling the incident angle of the laser light into the splitting device, the quality of the coating reflection material, and the thickness of the coating reflection material.

Figure 4:
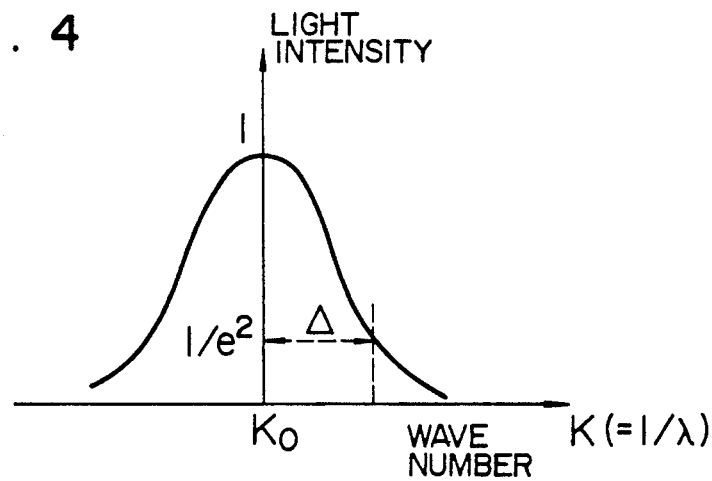
FIG. 4 is a diagram showing spectrum distribution of a laser.

It is desirable that the split light beams emitted from the splitting device to be used in the present invention have no interference with each other as described later. In this case, such split light beams can be realized if the distance between the two reflection plates 16-1 and 16-2 shown in FIG. 3 is set so that each of optical path differences between adjacent split light beams is longer than the interferable distance (coherent length) of the laser light. That is, in the case where the spectrum of the laser light spreads by about $\pm\Delta$ from a central wave number $\kappa_0$ (that is, $1/\lambda_0$ when the central wavelength is represented by $\lambda_0$) as shown in FIG. 4, interference between the split light beams can be disregarded if the optical path difference $\Delta l$ between adjacent split laser light beams satisfies the following condition:

$$\Delta l \geq \frac{2}{\pi\Delta}$$

In the case of using a KrF excimer laser having a width of wavelength of $\Delta\lambda = \pm 0.0025$ nm, the central wavelength $\lambda_0$ of laser light is 248.4 nm and the coherent length $2/\pi\Delta$ of the laser light is 9 mm because the central wavelength corresponds to $\Delta = 0.7$ cm$^{-1}$.

Figure 5:
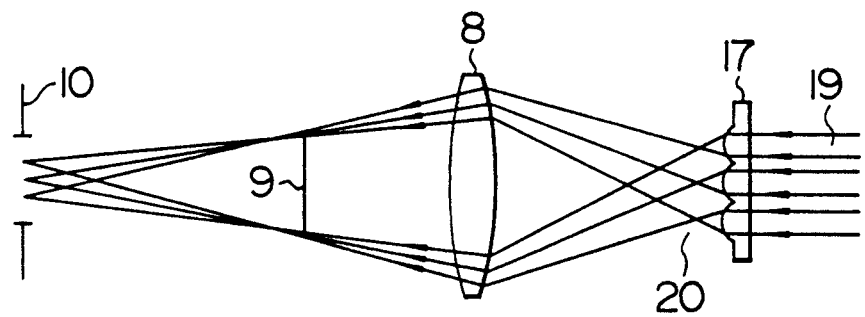
FIG. 5 is a diagram for explaining the operation of the splitting device according to the present invention, the integrator, and the condenser lens.

FIG. 5 shows an optical system for illuminating a mask with split light from the splitting device. All split light beams 19 are entered into corresponding lenses of a lens array 17 also called an integrator. The lens array 17 forms an array of point images 20 which are focused on an entrance pupil 10 of a projection lens 11 by means of a condenser lens 8. The array of point images 20 formed on the entrance pupil 10 make a gathering of incoherent point images because the splitting device is set so that all the split light beams emitted from the splitting device do not interfere with each other as described above. Viewed from another angle, since the array of point images 20 formed by the lens array 17 do not interfere with each other, the illumination on the mask 9 can be made to have no interference noises so that an excellent focusing pattern of the mask 9 having no interference noises can be obtained by means of a projection lens 11. Further, uniform irradiation can be realized by disposing the mask 9 on a focal plane of the condenser lens 8.

Figure 6:
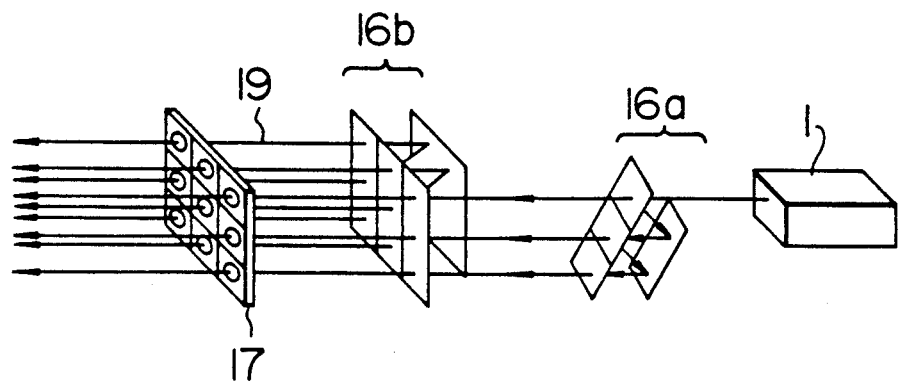
FIG. 6 is a diagram for explaining the two-dimensional light splitting using two splitting devices.

Although FIG. 5 thus illustrates the case where an array of point light sources arranged in one dimension, it is possible to generate split light beams 19 arranged in two-dimensional matrix if two splitting devices 16a and 16b are used, and it is possible to generate an array of point light sources arranged in two-dimensional matrix if a lens matrix is used as the integrator 17, as shown in FIG. 6.

Figure 7:
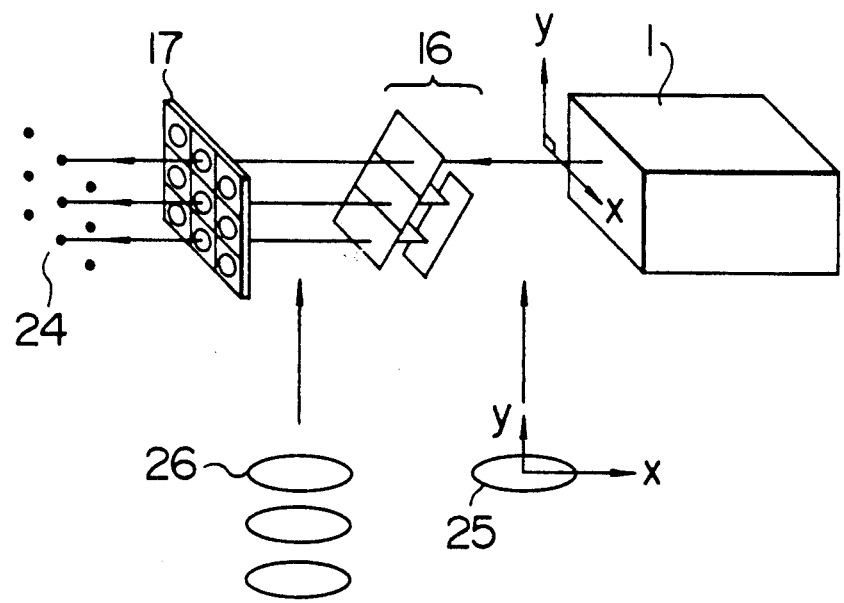
FIG. 7 is a diagram for explaining the two-dimensional light splitting using one splitting device.

Further, the sectional light intensity distribution of the light emitted from an excimer laser 1 is elliptical as shown by the reference numeral 25 in FIG. 7. That is, the wide light distribution in the x-direction has a light characteristic which is poor in interference, that is, low in coherency, while the narrow light distribution in the y-direction has a light characteristic which is better in interference. Therefore, the splitting device 16 is set so that light is split in the direction where the light distribution is narrow and good in interference property, that is, in the y-direction, and any splitting device for splitting light is not used in the direction where the light distribution is wide and poor in interference property, that is, in the x-direction. If a split pattern 26 formed by the splitting device 16 is entered into an integrator constituted by a lens matrix 17, two-dimensional point image distribution can be realized in an array of focal spots 24 of the lens matrix 17. Here, the two-dimensional point image distribution can be realized in a manner so that laser light having wide light distribution in the x-direction is split in the y-direction by using only one splitting device. Since interference between point images adjacent in the x-direction as well as in the y-direction is reduced, it is possible to obtain an excellent focal pattern illumination in which no interference noises are generated even if the splitting device is used together with the projection lens.

As described above, in the optical projection apparatus using laser light according to the present invention, it is possible to realize high-accurate optical projection in which interference noises due to laser coherency are reduced without mechanically scanning the laser light.

What is claimed is:

1. An optical projection apparatus comprising:
   a laser source;
   a splitting device for splitting light emitted from said laser source into a plural incoherent split light beams having light intensity equal to each other;
   an illuminating optical system for focusing each of said split light beams; and
   a projection optical system for projecting an image of a pattern of a mask illuminated with said split light beams from said illumination optical system into a sample;
   wherein said splitting device is constituted by a first reflection plate constituted by divisional portions respectively having predetermined reflection coefficients different from each other, and a second reflection plate arranged so as to return light reflected from one of said divisional portions of said first reflection plate to said first reflection plate so that said returned light enters into different one of said divisional portions of said first reflection plate having a reflection coefficient different from that of said one divisional portion, and in which a distance along which light reciprocates once between said first and second reflection plates is held so as to be longer than a coherent length and respective split light beams emitted from said divisional portions of said first reflection plate enter into corresponding lens portions of said illumination optical system.

2. An apparatus according to claim 1, in which reflection coefficient distribution of said first reflection plate is set so as to establish the relation: $R_{i-1} = 1/\{1+R(1-R_i)\}$, where $R_i$ and $R_{i-1}$ respectively represent the reflection coefficient of the i-th divisional portion of said first reflection plate and the reflection coefficient of the (i−1)th divisional portion adjacent to said i-th divisional portion respectively, and R represents the reflection factor of said second reflection plate.

3. An apparatus according to claim 2, in which said mask is disposed on a focal plane of said illumination optical system.

4. An apparatus according to claim 3, in which said illumination optical system has a lens array.

5. An apparatus according to claim 3, in which said illumination optical system has a lens matrix.

6. An apparatus according to claim 3, in which said illumination optical system focuses an image generated by a lens matrix onto an entrance pupil plane of said projection optical system.

7. An optical projection apparatus:
   wherein said laser source is an excimer laser.

8. An optical projection apparatus comprising:
   a laser source for emitting light;
   a splitting device for splitting the light emitted from said laser source, said splitting device being constituted by a first reflection plate constituted by divisional portions respectively having predetermined reflection coefficients different from each other, and a second reflection plate arranged so as to return light reflected from one of said divisional portions of said first reflection plate to said first reflection plate so that said returned light enters into different one of said divisional portions of said first reflection plate having a reflection coefficient different from that of said one divisional portion, a distance along which light reciprocates once between said first and second reflection plates being held so as to be longer than a coherent length;
   an integrator having a plurality of lens portions into which the respective split light beams emitted from said divisional portions of said first reflection plate are entered;
   a condenser lens for irradiating a mask with light from said integrator; and
   a projection lens for focusing a pattern of said mask.

9. An optical projection apparatus according to claim 8, in which reflection coefficient distribution of said first reflection plate is set so as to establish the relation: $R_{i-1} = 1/\{1+R(1-R_i)\}$, where $R_i$ and $R_{i-1}$ respectively represent the reflection coefficient of the i-th divisional portion of said first reflection plate and the reflection coefficient of the (i−1)th divisional portion adjacent to said i-th divisional portion respectively, and R represents the reflection coefficient of said second reflection plate.

* * * * *